US012195875B2

(12) United States Patent
Dong et al.

(10) Patent No.: US 12,195,875 B2
(45) Date of Patent: Jan. 14, 2025

(54) LASER PROCESSING SYSTEM INTEGRATED WITH MBE DEVICE

(71) Applicant: Wuhan University, Hubei (CN)

(72) Inventors: Fang Dong, Wuhan (CN); Sheng Liu, Wuhan (CN); Cheng Lei, Wuhan (CN); Yueyun Weng, Wuhan (CN)

(73) Assignee: Wuhan University, Wuhan (CN)

( * ) Notice: Subject to any disclaimer, the term of this patent is extended or adjusted under 35 U.S.C. 154(b) by 0 days.

(21) Appl. No.: 18/670,872

(22) Filed: May 22, 2024

(65) Prior Publication Data
US 2024/0309544 A1    Sep. 19, 2024

(30) Foreign Application Priority Data

May 29, 2023   (CN) .......................... 202310611288.5

(51) Int. Cl.
*C30B 23/00*    (2006.01)
*C30B 23/06*    (2006.01)
*G02B 17/08*    (2006.01)

(52) U.S. Cl.
CPC .......... *C30B 23/002* (2013.01); *C30B 23/063* (2013.01); *G02B 17/08* (2013.01)

(58) Field of Classification Search
CPC ..... C30B 23/00; C30B 11/003; C30B 23/063; C30B 23/002; H01L 21/02631; H01L 2225/06589; H01L 2924/12042
See application file for complete search history.

(56) References Cited

U.S. PATENT DOCUMENTS 5,041,719 A  *  8/1991  Harris ................... C30B 23/002
                                                219/390
5,858,086 A  *  1/1999  Hunter .................... C30B 25/00
                                                117/88

(Continued)

FOREIGN PATENT DOCUMENTS

CN       115679442 A      2/2023
JP       2019177382 A     10/2019

OTHER PUBLICATIONS

Chinese Doctoral Dissertations Full-text Database, "Research on the Crystal Quality Control of Nitride Film With Laser" by Fang Dong, Retrieved on May 11, 2024, Known about as early as Mar. 2021, pp. 1-9.

(Continued)

*Primary Examiner* — Jaehwan Oh

(57) ABSTRACT

Provided herein is a laser processing system integrated with an MBE device, including an MBE growth chamber, a sample table, an optical path mechanism, a heat insulation mechanism, and a cooling mechanism. An opening is formed in a side of the MBE growth chamber. The sample table is fixed in the MBE growth chamber, corresponds to a position of the opening, and is used for placing a substrate sample material. The optical path mechanism is relatively arranged on a side of the MBE growth chamber, and the optical path mechanism is provided with a light-emitting end. A side of the light-emitting end penetrates through the opening of the MBE growth chamber, extends into the MBE growth chamber, and is spaced apart from the sample table. The optical path mechanism is sealedly connected to the opening of the MBE growth chamber. By integrating the optical path mechanism within the MBE device and utilizing direct laser writing, the system facilitates close-range processing of the sample, enhancing the laser's focusing capa- (Continued)

bility and effectively ensuring the precision and quality of laser processing.

6 Claims, 16 Drawing Sheets

(56) References Cited

U.S. PATENT DOCUMENTS

| | | | |
|---|---|---|---|
| 10,493,560 B2 | 12/2019 | Kusaka | |
| 11,015,262 B2 | 5/2021 | Najafi-Yazdi | |
| 2006/0005763 A1* | 1/2006 | Schowalter | H01L 33/0075 117/81 |

OTHER PUBLICATIONS

Laser Optoelectronics Progress, vol. 41, No. 2, "Excimer Laser Based Micro-Manufacturing Technology and Its Application" by Liu Sheng et al., Retieved on May 11, 2024, Known about as early as Feb. 29, 2004, pp. 1-7.

\* cited by examiner

LASER PROCESSING SYSTEM INTEGRATED WITH MBE DEVICE

TECHNICAL FIELD

The present invention pertains to laser processing technologies, specifically focusing on a laser processing system integrated with an Molecular Beam Epitaxy (MBE) device.

BACKGROUND

Laser technology is at the forefront of advanced science and technology, representing heightened productivity, and has become a focal point for major developed countries globally. In comparison to conventional lasers, femtosecond lasers exhibit higher energy density, occupy smaller spatial scales, and operate on shorter time scales. These characteristics enable femtosecond lasers to process nearly any material with exceptional quality and precision, facilitating the production of intricate three-dimensional structures. Laser processing offers unparalleled advantages over conventional methods.

Publication no. CN115679442A discloses an MBE ultrafast laser auxiliary system and method. The system comprises an ultrafast laser device and an optical path system, which includes a sequence of reflectors: a first reflector, a femtosecond/picosecond reflector, and a second reflector. Light emitted by the ultrafast laser device undergoes sequential reflection by these components, converging at least one path of ultrafast laser onto a silicon-based substrate for heating and modulation.

However, the laser auxiliary system described in the comparative document incorporates a reserved window at the bottom of the MBE device's chamber. Light, reflected by the optical path system, penetrates the chamber of the MBE device through this window, converging onto the silicon-based substrate. However, the external reflection of light into the MBE device's chamber by the optical path system results in a considerable distance between the refracted optical path and the silicon-based substrate. This elongated distance compromises laser focusing capability, leading to inadequate processing precision and ultimately affecting the quality of laser processing.

SUMMARY

In light of the aforementioned, the present invention introduces a laser processing system integrated with an MBE device, which incorporates an optical path mechanism within the MBE device. Employing direct laser writing, this system operates at close proximity to the samples, thereby enhancing laser focusing capability and effectively ensuring precision and quality in laser processing.

The technical solution of the present invention is as follows: it provides a laser processing system integrated with an MBE device, comprising an MBE growth chamber and a sample table, wherein An opening is created on the side of the MBE growth chamber; and The sample table is secured within the MBE growth chamber, corresponding to the position of the opening, and is used to hold substrate sample material.

The laser processing system additionally includes an optical path mechanism, a heat insulation mechanism, and a cooling mechanism, wherein The optical path mechanism is situated adjacent to the side of the MBE growth chamber and features a light emitting end. One side of the light emitting end penetrates through the opening of the MBE growth chamber, extends into the chamber, and is positioned at a distance from the sample table. The optical path mechanism is hermetically connected to the opening of the MBE growth chamber.

The heat insulation mechanism is placed on the side of the light emitting end of the optical path mechanism and is utilized to minimize heat radiation reaching the lens of the optical path mechanism.

The cooling mechanism is positioned on the outer side of the optical path mechanism and comprises a cooling channel. A heat exchange medium flows through the cooling channel, rapidly dissipating heat accumulated by the optical path mechanism to the exterior.

Based on the aforementioned technical solution, preferably, the optical path mechanism includes an external optical path assembly, an internal optical path assembly, and an objective lens, wherein One end of the external optical path assembly penetrates through the opening of the MBE growth chamber and extends into it, serving to connect to an external laser device;

The internal optical path assembly is concentrically positioned within the external optical path assembly, located at the end of the latter extending into the MBE growth chamber; and The objective lens, positioned at the end of the internal optical path assembly away from the external optical path assembly, acts as the light emitting end of the optical path mechanism. A laser, emitted by the external laser device, is reflected into the internal optical path assembly via the external optical path assembly and processes the substrate sample material through the objective lens.

Additionally, preferably, the heat insulation mechanism comprises a shield body and a heat-insulation light-transmission member, wherein The shield body, cylindrical and internally hollow, is situated on the side of the external optical path assembly close to the sample table. Positioned on outer sides of the internal optical path assembly and the objective lens, the shield body includes a light transmission hole on the side facing the sample table; and The heat-insulation light-transmission member is placed within the shield body, located on the side of the objective lens away from the internal optical path assembly, and is concentrically aligned with the axis of the objective lens.

The heat-insulation light-transmission member is placed within the shield body, located on the side of the objective lens away from the internal optical path assembly, and is concentrically aligned with the axis of the objective lens.

Moreover, preferably, the number of heat-insulation light-transmission members is at least two, spaced apart in the axial direction of the shield body, and made of quartz glass.

Additionally, preferably, the cooling mechanism includes a sleeve member and an internal support member, wherein The sleeve member, fixed to the external optical path assembly by a flange, is located on the outer side of the assembly. At least two liquid passage openings, symmetrically distributed, are formed on the outer side of the sleeve member;

The internal support member, fixedly situated within the sleeve member, divides the internal space of the sleeve member into a first cavity and a second cavity, which are not in communication with each other;

The first cavity serves as the cooling channel of the cooling mechanism and connects with the liquid passage openings, while the second cavity accommodates the external optical path assembly; and The heat exchange medium flows through the liquid passage openings and the first cavity, carrying away the heat conducted by the objective.

Additionally, preferably, an adjusting mechanism is included, wherein

The adjusting mechanism, fixed relative to the ground and spaced apart from the MBE growth chamber, includes a movable portion capable of multi-dimensional movement. The side of the sleeve member away from the internal optical path assembly is fixed to the center of the movable portion by a flange, and the adjusting mechanism drives multi-dimensional adjustments of the optical path mechanism connected to the sleeve member to shift the position of the laser focused on the surface of the substrate sample material.

Furthermore, preferably, the adjusting mechanism is a six-degree-of-freedom motion platform.

Moreover, preferably, a telescopic sleeving member is further included, wherein

The telescopic sleeving member is positioned on the outer side of the sleeve member within the MBE growth chamber. The two ends of the telescopic sleeving member are securely connected to the side of the sleeve member adjacent to the heat insulation mechanism and to the opening of the MBE growth chamber by flanges, ensuring a sealed connection. The telescopic sleeving member remains spaced apart from the outer wall of the sleeve member and is utilized to ensure movement sealing between the optical path mechanism and the MBE growth chamber.

Additionally, a sealing assembly is included, wherein

Two side ends of the sealing assembly are securely connected to the internal optical path assembly and the external optical path assembly respectively by flanges. The sealing assembly incorporates a light transmission portion, enabling the transmission of light from the external optical path assembly to the internal optical path assembly for a laser source; and The internal optical path assembly is maintained in a vacuum environment within the MBE growth chamber via the sealing assembly.

Compared with the prior art, the laser processing system integrated with the MBE device of the present invention offers the following advantageous effects:

(1) The optical path mechanism extends into the MBE growth chamber and is hermetically connected to it, allowing the optical path mechanism to operate under a vacuum high-temperature environment within the chamber. By minimizing heat radiation and facilitating heat conduction and dissipation on the light emitting side of the optical path mechanism through the provided heat insulation mechanism and cooling mechanism, the temperature of the light emitting end of the optical path mechanism remains within a normal operating range. The system integrates the optical path mechanism into the MBE device, utilizing direct laser writing to process samples at close range, thereby enhancing laser focusing capability and effectively ensuring precision and quality in laser processing;

(2) Sealing the internal optical path assembly from the MBE growth chamber using the sealing assembly and the telescopic sleeving member ensures that the optical path mechanism can perform laser processing in a high vacuum environment, while also ensuring sealing between the optical path mechanism and the MBE growth chamber during movement;

(3) The optical path mechanism integrates a laser processing optical path, a microscopic imaging optical path and an ultrafast imaging optical path, simplifies structures of the optical paths, and reduces use of devices, and the laser processing optical path, the microscopic imaging optical path and the ultrafast imaging optical path are all designed as a module interface, and can be directly interfaced with an external output optical path device according to actual requirements, so as to be convenient and convenient; and (4) The shield body provided is made of alloy steel with a highly polished outer surface. The polishing treatment reduces the surface emissivity of the radiation prevention shield body, while the gold film coating on the outer surface further reduces its emissivity and increases the heat conductivity coefficient, thus facilitating heat conduction.

BRIEF DESCRIPTION OF DRAWINGS

To elucidate technical solutions in embodiments of the present invention or the prior art, accompanying drawings relevant for descriptions of the embodiments or the prior art are briefly introduced below. It is evident that the drawings in the following descriptions represent only some embodiments of the present invention, and obtaining other drawings based on these illustrations would be apparent to a person of ordinary skill in the art without involving any inventive effort.

DETAILED DESCRIPTION OF THE EMBODIMENTS

Figure 1:
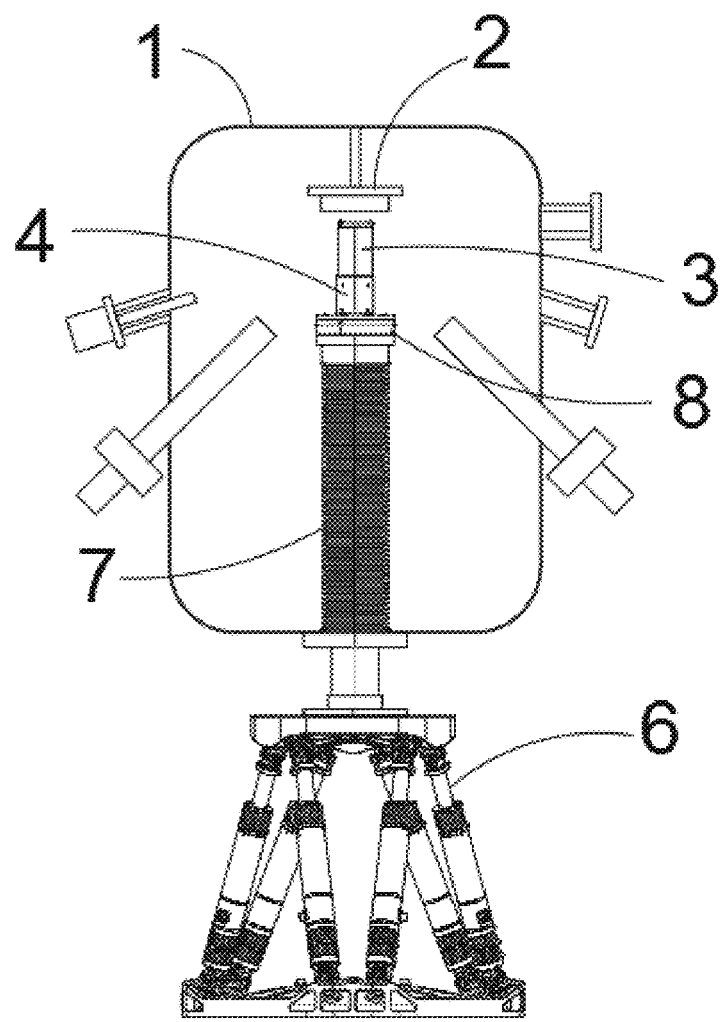
FIG. 1 shows a schematic structural view of a femtosecond laser processing system with an integrated MBE device of the present invention.
Figure 2:
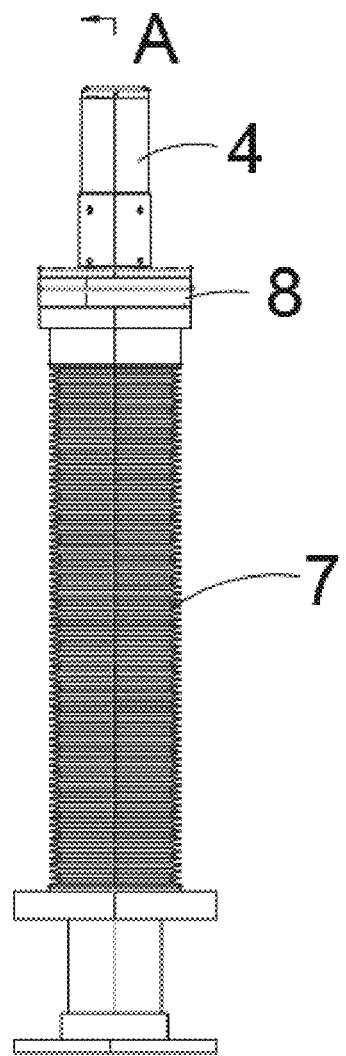
FIG. 2 shows a side view of the femtosecond laser processing system of the integrated MBE device of the present invention.
Figure 3:
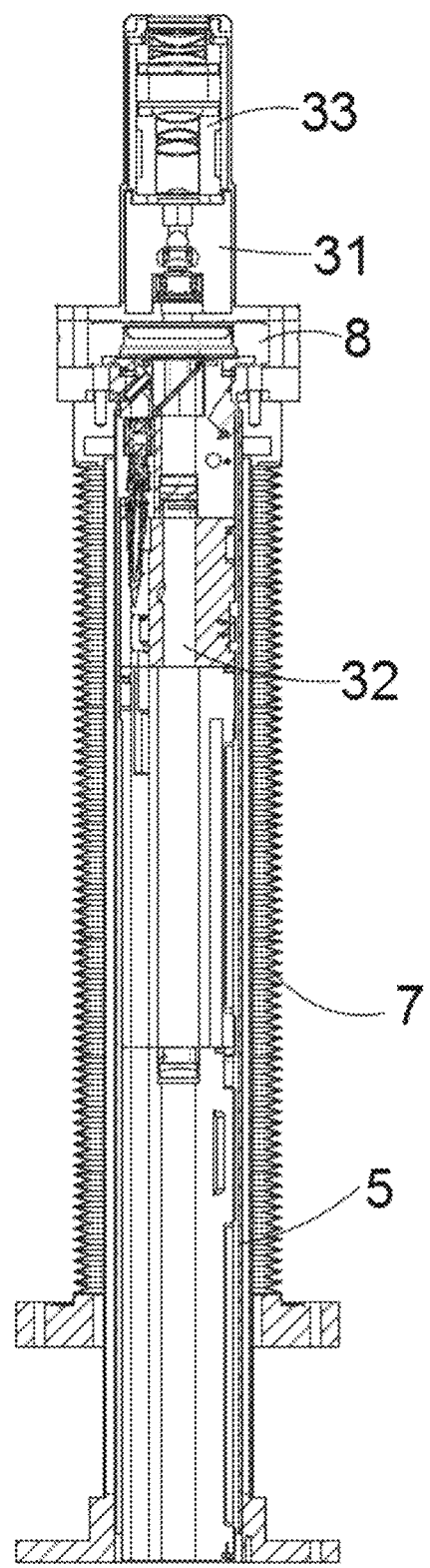
FIG. 3 shows a cross-sectional view at A-A of FIG. 2 of the femtosecond laser processing system of the integrated MBE device of the present invention.
Figure 4:
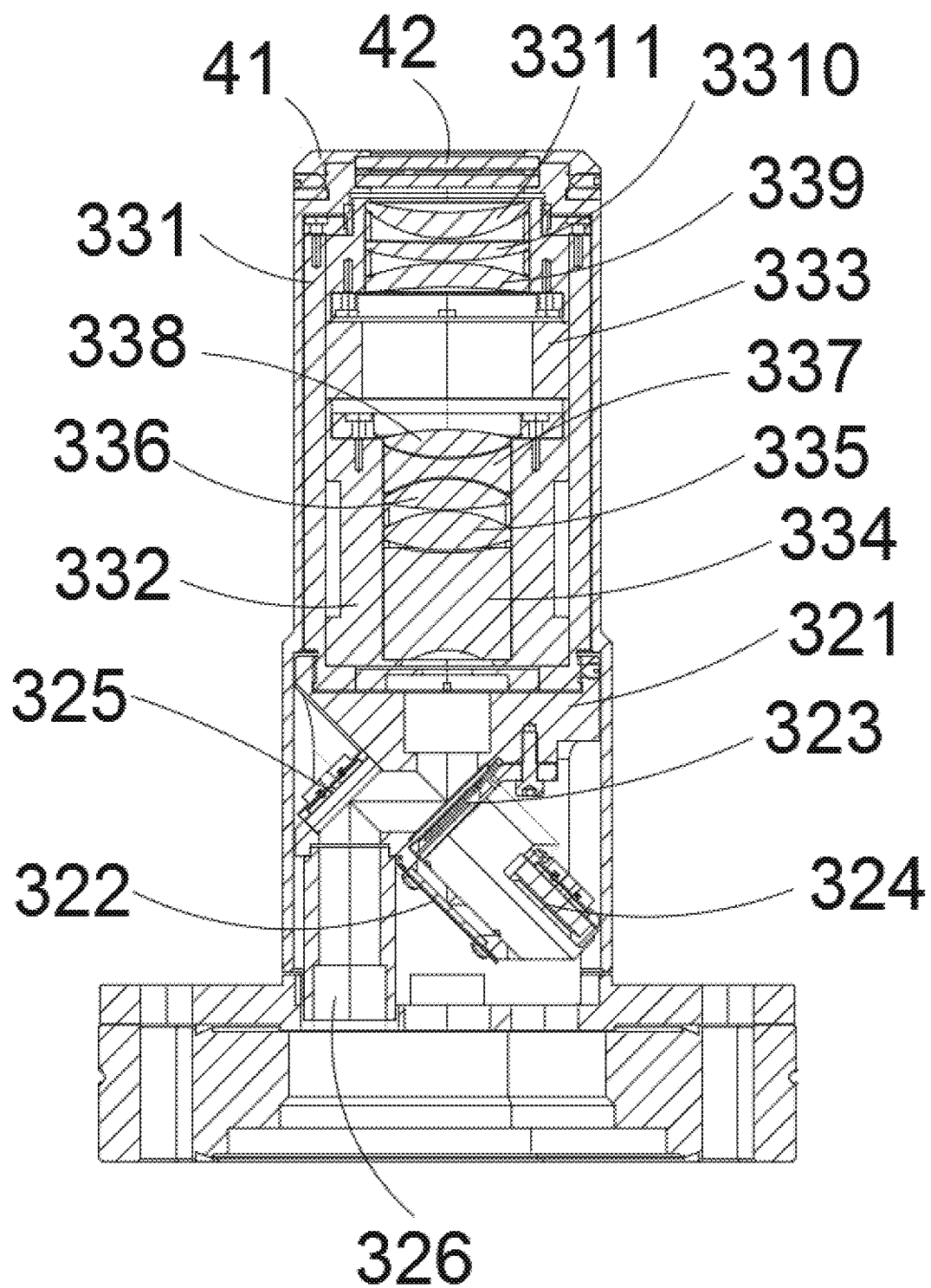
FIG. 4 shows a sectional view of the structural connection of the internal optical path assembly, the eyepiece and the thermal insulation mechanism of the femtosecond laser processing system with integrated MBE device of the present invention.
Figure 5:
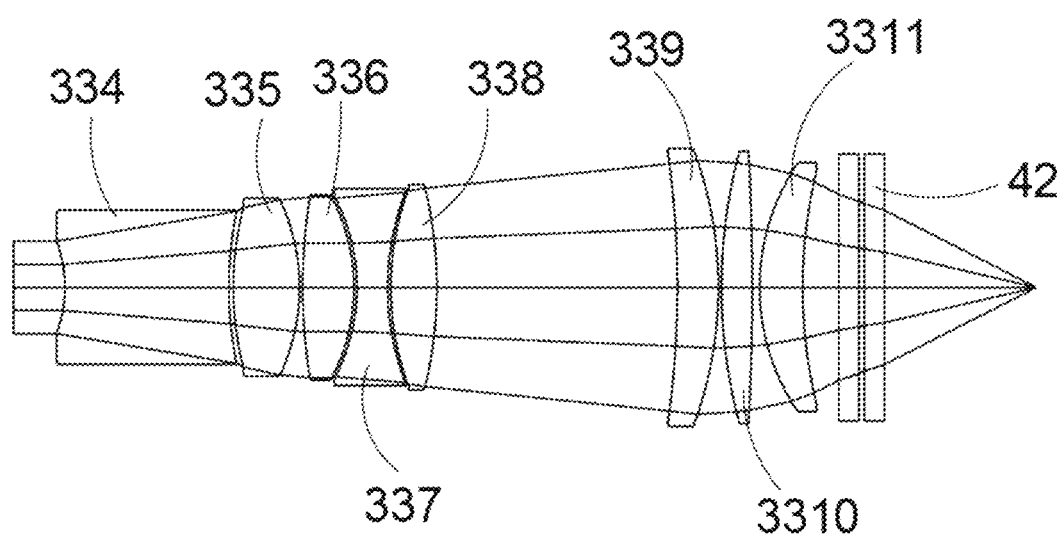
FIG. 5 shows a cross-sectional view of an eyepiece of the femtosecond laser processing system of the integrated MBE apparatus of the present invention.
Figure 6:
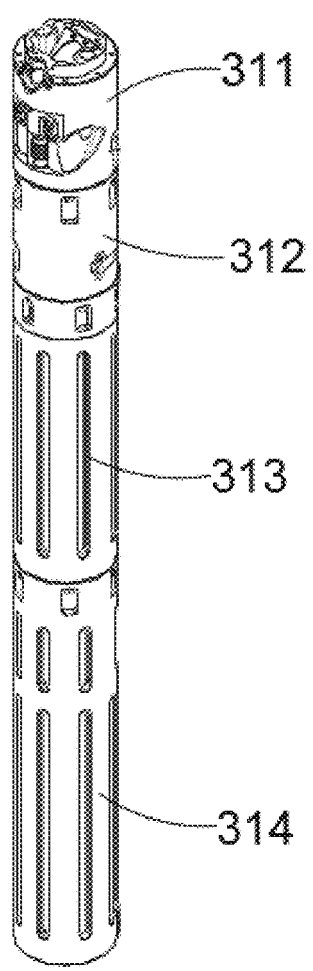
FIG. 6 shows a three-dimensional view of an external optical path structure of the femtosecond laser processing system of the integrated MBE device of the present invention.
Figure 7:
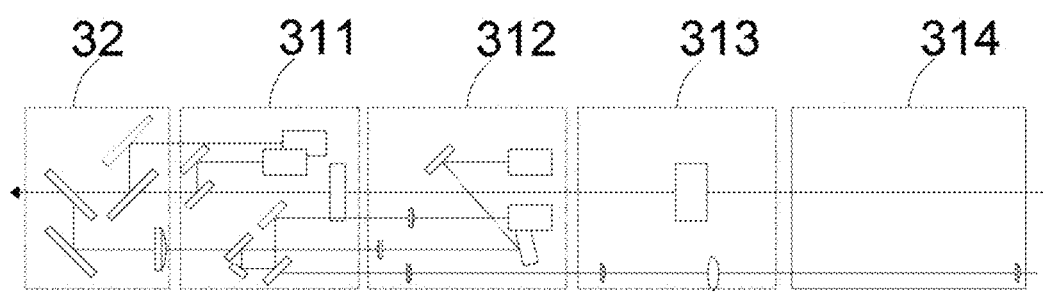
FIG. 7 shows a schematic diagram of the optical path structure of the femtosecond laser processing system of the integrated MBE device of the present invention.
Figure 8:
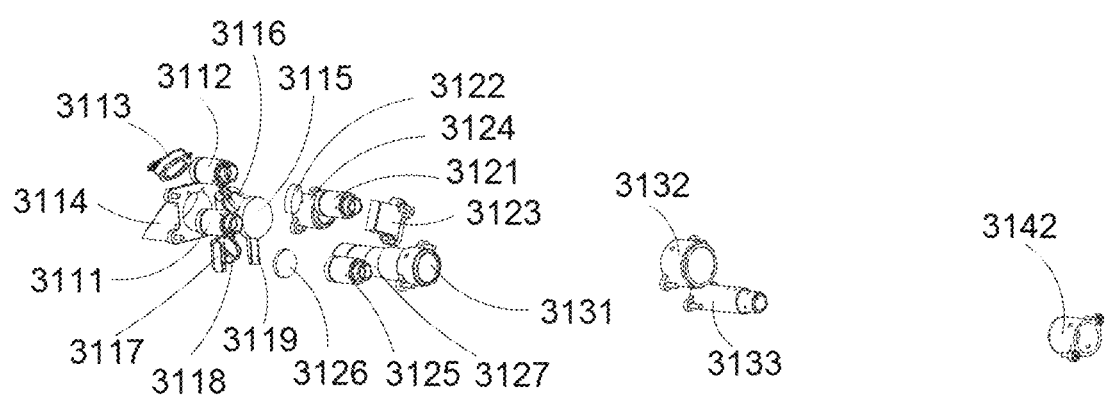
FIG. 8 shows an arrangement of the optical path structure of the femtosecond laser processing system of the integrated MBE device of the present invention.
Figure 9:
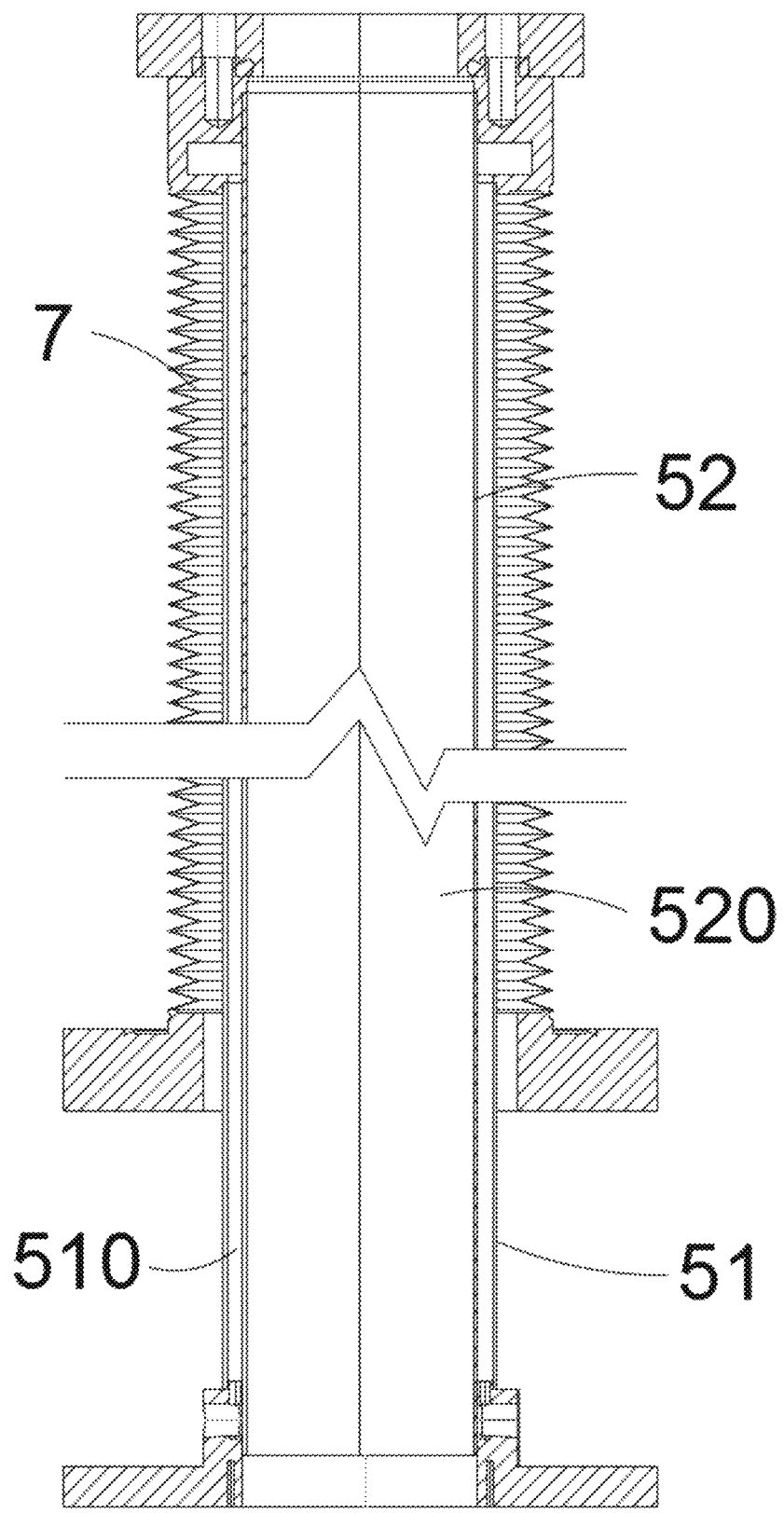
FIG. 9 shows a simulation model diagram of the geometric structure in a high-temperature vacuum environment of the femtosecond laser processing system of the integrated MBE device of the present invention.

Reference will now be made in detail to the embodiments of the present invention, examples of which are illustrated in the accompanying drawings. It is to be understood that the present invention is to be considered as illustrative and not restrictive. All other embodiments obtained by persons of ordinary skill in the art based on the embodiments of the present invention without inventive efforts shall belong to the scope of protection of the present invention.

Referring to FIGS. 1-9, the laser processing system integrated with an MBE device of the present invention comprises an MBE growth chamber 1 and a sample table 2. An opening is formed on one side of the MBE growth chamber 1. The sample table 2 is fixed within the MBE growth chamber 1, aligning with the opening, and is used to hold a substrate sample material.

In the prior art, a substrate sample material is typically placed on a sample table 2 inside an MBE growth chamber 1. Then, an external laser is directed by an optical path system, and light enters the MBE growth chamber 1 through a reserved window, focusing on the sample stage 2 for processing. However, the distance from the refracted optical path to the silicon-based substrate is long, resulting in poor laser focusing capability and inadequate processing precision, thereby affecting the quality of laser processing.

In the present embodiment, an optical path mechanism 3, a heat insulation mechanism 4, and a cooling mechanism 5 are incorporated. The optical path mechanism 3 is arranged adjacent to a side of the MBE growth chamber 1 and is equipped with a light emitting end. The light emitting end penetrates through the opening of the MBE growth chamber 1, extends inside, and is spaced apart from the sample table 2. The optical path mechanism 3 is hermetically sealed to the opening of the MBE growth chamber 1. The heat insulation mechanism 4 is positioned on the side of the light emitting end of the optical path mechanism 3 to reduce heat radiation reaching the lens of the optical path mechanism 3. The cooling mechanism 5 is placed on the outer side of the optical path mechanism 3 and includes a cooling channel through which a heat exchange medium flows, quickly dissipating the accumulated heat from the optical path mechanism 3 to the outside.

It's essential to note that when the MBE device grows a thin film material, it operates in an ultra-high vacuum environment of 10-7 Pa, and the temperature of the substrate sample material may reach up to 1000° C. However, the operational temperature range of an existing laser processing system is generally between −5-50° C., which is unsuitable for operation in a vacuum high-temperature environment.

The light emitting end of the optical path mechanism 3 extends 20 mm into the MBE growth chamber 1 from the substrate sample material on the sample table 2.

In this embodiment, by extending the light emitting end of the optical path mechanism 3 into the MBE growth chamber 1 and sealing it with the opening of the MBE growth chamber 1, the MBE growth chamber 1 maintains a vacuum environment. Furthermore, by minimizing heat radiation and conducting heat dissipation from the light emitting side of the optical path mechanism 3 through the heat insulation mechanism 4 and cooling mechanism 5, the temperature of the light emitting end of the optical path mechanism 3 remains within the normal operating range. Therefore, the optical path mechanism 3 is integrated into the MBE device, enhancing laser focusing capability through direct laser writing, and ensuring precision and quality in laser processing.

As the laser processing system is integrated with the MBE device, the available space within the MBE device is limited, posing challenges for installation.

In this embodiment, the optical path mechanism 3 comprises an external optical path assembly 31, an internal optical path assembly 32, and an objective lens 33. The external optical path assembly 31 penetrates through the opening of the MBE growth chamber 1 and extends inside, connecting to an external laser device. The internal optical path assembly 32 is concentrically arranged within the external optical path assembly 31, extending into the MBE growth chamber 1. The objective lens 33, positioned at the end of the internal optical path assembly 32 away from the external optical path assembly 31, serves as the light emitting end of the optical path mechanism 3. A laser from the external laser device is reflected into the internal optical path assembly 32 through the external optical path assembly 31, and the substrate sample material is processed through the objective lens 33.

Importantly, since it's not convenient to observe the thin film material within the MBE growth chamber 1, the optical path mechanism 3 integrates a laser processing optical path, a microscopic imaging optical path, and an ultrafast imaging optical path. The laser processing optical path is used for laser processing of the sample material, while the microscopic imaging optical path is for microscopic imaging of the material sample's surface, and the ultrafast imaging optical path is for imaging the sample with ultra-high temporal resolution.

The internal optical path assembly 32 in this embodiment comprises a first cylinder 321, within which a first dichroscope 322, a second dichroscope 323, a first reflector 324, a second reflector 325, and a first planoconvex lens 326 are fixedly mounted. The first dichroscope 322 and the second dichroscope 323 are arranged in a V shape in the middle of a mounting cavity. The first reflector 324 is positioned adjacent to the first dichroscope 322, parallel to it, while the second reflector 325 is placed on the opposite side of the first dichroscope 322, also parallel to it. The first planoconvex lens 326 is positioned to correspond to the second reflector 325, with a line drawn from the center point of the first planoconvex lens 326 to the center point of the second reflector 325 being parallel to the axial horizontal line of the optical path mechanism 3.

The objective lens 33 is composed of a third cylinder 331, within which a fourth cylinder 332 and a fifth cylinder 333 are securely mounted. Successively fixed within the fourth cylinder 332 are a first biconcave lens 334, a first biconvex lens 335, a second biconvex lens 336, a second biconcave lens 337, and a second biconvex lens 338. The first biconcave lens 334 is positioned closest to the internal optical path assembly 32. Within the fifth cylinder 333, a first concave lens 339, a second planoconvex lens 3310, and a second concave lens 3311 are sequentially fixed. The first concave lens 339 is situated near the second biconcave lens 337.

The external optical path assembly 31 consists of a sixth cylinder 311, a seventh cylinder 312, an eighth cylinder 313, and a ninth cylinder 314. Within the sixth cylinder 311, a series of optical components are arranged, including a first optical fiber coupling lens 3111, a second optical fiber coupling lens 3112, a third reflector 3113, a first beam splitter 3114, an eyepiece 3115, a second beam splitter 3116, a fourth reflector 3117, a third beam splitter 3118, and a fifth reflector 3119. The first optical fiber coupling lens 3111 corresponds to the first reflector 324, while the second optical fiber coupling lens 3112 corresponds to the third reflector 3113. The first beam splitter 3114 is centrally located within the sixth cylinder 311, aligned with the eyepiece 3115. Positioned close to the first beam splitter 3114 is the third reflector 3118, which reflects a laser beam to the center point of the first beam splitter 3114. The second beam splitter 3116 corresponds to the fourth reflector 3117, reflecting light back from the sample table 2. The third beam splitter 3118 corresponds to both the fourth reflector 3117 and the fifth reflector 3119. Additionally, a set of optical components are arranged within the seventh cylinder 312, including a third optical fiber coupling lens 3121, a sixth reflector 3122, a grating 3123, a third planoconvex lens 3124, a fourth optical fiber coupling lens 3125, a fourth planoconvex lens 3126, and a fifth planoconvex lens 3127. Furthermore, a sixth planoconvex lens 3131, a CCD camera 3132, and a diaphragm 3133 are arranged within the eighth cylinder 313, while a seventh planoconvex lens 3141 is placed within the ninth cylinder 314.

The external optical path assembly 31 also incorporates an external laser device, a frequency multiplier, and a photonic crystal transmission optical fiber.

In the laser processing optical path, a laser is emitted by its laser device, transmitted to the first optical fiber coupling lens 315 via the photonic crystal optical fiber, and then directed towards the first dichroscope 322 after reflection by the first reflector 324. It passes through the second dichroscope 323 after reflection by the first dichroscope 322, and finally reaches the objective lens 33 for processing the substrate sample material.

For the microscopic imaging optical path, red illumination light is transmitted via the optical fiber to the second optical fiber coupling lens 3112 and reflected by the third reflector 3113 towards the first beam splitter 3114. Light separated by the first beam splitter 3114 passes through the first dichroscope 322, the second dichroscope 323, and the objective lens 33 successively, reaching the substrate sample material. After reflecting off the sample material, the light passes back through the objective lens 33, the second dichroscope 323, the first dichroscope 322, and the first beam splitter 3114, some of it passing through the eyepiece 3115 before reaching the CCD camera 3132 for imaging.

The reflectors within the optical path mechanism 3 are made of fused quartz and coated with dielectric films to increase laser reflectivity and reduce loss. The first dichroscope 322 utilizes a 500 nm dichroic long-pass filter to reflect the laser used for processing, while the second dichroscope 323 employs a 700 nm dichroic short-pass filter to transmit the laser used for processing and reflect the laser used for ultrafast imaging.

It's worth noting that due to the flexibility of optical fibers, the arrangement of optical paths can be conveniently achieved. The bulky and heavy external laser device is situated outside an adjusting mechanism 6, ensuring the transmission of laser beams even when the adjusting mechanism 6 moves the optical path mechanism 3.

Notably, the first beam splitter 3314 is an ultraviolet quartz broadband beam splitter with a model BSW05, featuring a 50:50 beam splitting ratio and a wavelength range of 400-700 nm. The eyepiece 3115 adopts a symmetric design, consisting of two identically structured double-glued lenses with a focal length of 135 mm, effectively correcting chromatic aberration and astigmatism to ensure that the observed surface image of the sample remains undistorted. The CCD camera 3132 is of model 1500M-CL-TE.

The ultrafast imaging optical path operates by emitting a laser from the external laser device to the sixth reflector 3122, refracting it towards the grating 3123. After passing through the grating 3123, the laser is dispersed into different wavelengths, forming a high-speed time series in the time domain. Subsequently, the laser traverses the third planoconvex lens 3124, the second beam splitter 3116, the first planoconvex lens 326, the second reflector 325, and the second dichroscope 323 in sequence before focusing on the sample surface through the objective lens 33. The laser reflected by the sample surface then follows a reverse path through the optical components before reaching the external ultrafast imaging system. This setup allows for imaging with ultrahigh temporal resolution, enabling the observation of sample changes over extremely short time periods.

By integrating the laser processing, microscopic imaging, and ultrafast imaging optical paths, the system simplifies optical path structures, reduces the number of devices required, and allows for modular interchangeability. Additionally, during sample processing, the surface of the sample can be imaged microscopically, facilitating observation of the laser's effects. The cylindrical design of the outer contour of the optical path mechanism 3 maximizes integration while occupying minimal space, meeting the mounting requirements of the confined MBE internal space.

In a preferred embodiment, the heat insulation mechanism 4 comprises a shield body 41 and heat-insulation light-transmission members 42. The shield body 41, cylindrical and internally hollow, is positioned on the side of the external optical path assembly 31 near the sample table 2. It surrounds the external side of the internal optical path assembly 32 and the objective lens 33, with a light transmission hole on the side facing the sample table 2. Heat-insulation light-transmission members 42 are situated within the shield body 41, concentrically aligned with the objective lens 33 and positioned away from the internal optical path assembly 32.

The objective lens 33, being closest to the surface of the sample table 2, receives the largest area of heat radiation among all components in the optical path mechanism 3. Therefore, in this embodiment, a shield body 41 is added to the outer sides of the objective lens 33 and the internal optical path assembly 32 to block a significant portion of the radiation. This helps reduce the amount of heat absorbed by the objective lens 33 and lowers its temperature.

The shield body 41 has a thickness of 2 mm and is made of alloy steel with a smooth surface. A gold film is applied to the outer surface of the shield body 41 to facilitate rapid heat conduction. The outer surface of the shield body 41 undergoes high-level polishing to minimize surface emissivity, and then the gold film is applied to further reduce emissivity and increase heat conductivity, which enhances heat conduction efficiency.

At least two heat-insulation light-transmission members 42, made of quartz glass, are spaced apart within the shield body 41 along its axial direction. Quartz glass has a high melting point (>1000° C.) and can function normally under high-temperature vacuum conditions. The surface of the quartz glass is plated to further reduce heat radiation transmissivity, minimizing the amount of radiation reaching the lens on the objective lens 33.

Preferably, two heat-insulation light-transmission members 42 are used to achieve effective heat insulation for the objective lens 33. While increasing the number of heat-insulation light-transmission members 42 may further reduce the temperature of the objective lens surface, too many members can affect the design of the objective lens optical system and compromise laser quality, leading to increased laser loss during transmission.

Since the objective lens 33 remains within the MBE growth chamber 1, heat radiation absorbed by its shield body 41 is conducted towards the external optical path assembly 31. If heat conduction is slow, heat may accumulate over time, raising the temperature of internal optical devices and potentially causing damage.

In this embodiment, the cooling mechanism 5 comprises a sleeve member 51 and an internal support member 52. The sleeve member 51 is fixed on the outer side of the external optical path assembly 31, away from the internal optical path assembly 32, by a flange. It features at least two symmetrically distributed liquid passage openings on its outer side. The internal support member 52 divides the sleeve member 51's internal space into a first cavity 510, serving as the cooling channel, and a second cavity 520, which accommodates the external optical path assembly 31. Heat exchange medium flows through the liquid passage openings and the first cavity 510, carrying away heat conducted by the objective lens 33.

The liquid passage openings connect to the liquid outlet and inlet ends of external cooling circulating equipment, allowing circulating liquid to flow into the first cavity 510. This effectively removes heat, preventing heat accumulation and facilitating heat dissipation and temperature reduction.

Additionally, an adjusting mechanism 6 is included, fixed relative to the ground and spaced apart from the MBE growth chamber 1. It features a movable portion capable of multidimensional movement. The sleeve member 51 is fixed to the center of the movable portion via a flange on the side away from the internal optical path assembly 32. This adjusting mechanism 6 enables multidimensional adjustment of the optical path mechanism 3 connected to the sleeve member 51, allowing the laser's position focused on the surface of the substrate sample material to be adjusted.

Specifically, the adjusting mechanism 6 in this embodiment is a six-degree-of-freedom motion platform, such as model H-850.G2A.

To ensure sealing between the optical path mechanism 3 and the MBE growth chamber 1 during movement driven by the adjusting mechanism 6, a telescopic sleeving member 7 is employed. Positioned on the outer side of the sleeve member 51 and located within the MBE growth chamber 1, the telescopic sleeving member 7, typically a bellows, connects to both the sleeve member 51 and the opening of the MBE growth chamber 1 via flanges. This arrangement maintains movement sealing between the optical path mechanism 3 and the MBE growth chamber 1, allowing the sleeve member 51 to move with the adjusting mechanism 6 while ensuring a sealed environment.

In this embodiment, the telescopic sleeving member 7 is specifically designed as a bellows due to its elasticity. This design allows the sleeve member 51 to move along with the adjusting mechanism 6, enabling both horizontal and vertical movement of the optical path mechanism 3 within the second cavity 520. The upper and lower ends of the telescopic sleeving member 7 are sealedly connected to the MBE growth chamber 1 and the sleeve member 51 respectively using flanges. This arrangement ensures proper sealing between the MBE growth chamber 1 and the optical path mechanism 3 while the adjusting mechanism 6 drives the optical path mechanism 3 to move.

To ensure sealing between the internal optical path assembly 32 and the external optical path assembly 31, a sealing assembly 8 is further incorporated. The sealing assembly 8 is sealedly connected to the internal optical path assembly 32 and the external optical path assembly 31 at their respective side ends using flanges. Additionally, the sealing assembly 8 features a light transmission portion that facilitates the transmission of light from the side of the external optical path assembly 31 to the side of the internal optical path assembly 32, accommodating a laser source. This setup allows the internal optical path assembly 32 to maintain a vacuum environment within the MBE growth chamber 1 through the sealing assembly 8.

It's important to note that the sealing between the internal optical path assembly 32 and the MBE growth chamber 1 is achieved through the coordinated efforts of the sealing assembly 8 and the telescopic sleeving member 7. This sealing mechanism enables the optical path mechanism 3 to execute laser processing in a high-vacuum environment. Furthermore, the light transmission part is constructed using quartz material light-transmission glass.

Once a model is designed, it undergoes necessary simulations to verify its compliance with requirements and to develop improvement solutions based on simulation results. In this design, the structural model requires insulation to address heat transfer issues. Temperature changes induce thermal stress within a structure, leading to deformation, while the design of the optical system and the objective involves ray tracing of geometric optics.

The present invention also provides a method for optimizing a laser processing system integrated with an MBE device, outlined in the following steps:

Step 1: Establish a geometric model of the optical path mechanism and employ simulation software, such as COMSOL, to conduct a heat-transfer analog simulation on the model;

Step 2: Analyze the analog simulation result, correlating the temperature of the objective lens 33 with received heat radiation;

Step 3: Based on the analysis result, add a radiation prevention structure to the outer side of the objective in the geometric model of the optical path mechanism. Then, employ simulation software again to conduct a heat-transfer analog simulation on the model;

Step 4: Analyze the analog simulation result to assess the impact of the radiation prevention structure on heat radiation. Assume heat conduction and dissipation occur in a heat conduction mode;

Step 5: Based on the analysis result, add a water cooling mechanism to the geometric model of the optical path mechanism. Conduct an analog simulation for heat-transfer analog simulation of the geometric model under different flow rates;

Step 6: Analyze the analog simulation result to verify the reliability of the assumption made in Step 4;

Step 7: Perform a structural-thermal-optical (STOP) multi-physical field coupling simulation analysis on the optimized solution structure using COMSOL. Judge whether the optimized solution structure can operate normally under a vacuum high-temperature environment based on changes in the root-mean-square radius value of a plot diagram;

Step 8: Obtain an optimized solution.

Figure 10:
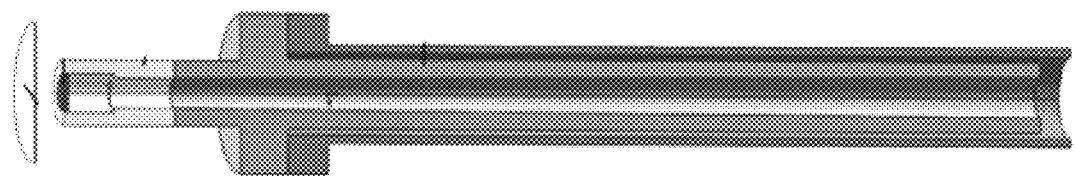
FIG. 10 shows the distribution of the simulation results of the temperature and the temperature simulation of the objective lens of the model of the femtosecond laser processing system of the integrated MBE device of the present invention.

In Step 1, COMSOL is used as the simulation software. To simplify the simulation, the geometric model of the objective lens 33 and the optical path mechanism 3 is streamlined. Specifically, the internal optical path assembly 32, external optical path assembly 31, telescopic sleeving member 7, and objective lens 33 structures are simplified. Only the second concave lens 3311 closest to the sample table 2 is retained in the objective lens 33, referencing the structure in FIG. 10.

It's worth noting that since this lens is closest to the high-temperature sample, where the temperature is highest, if the temperature of this lens remains below 50° C., the remaining lenses will undoubtedly operate within the normal operating temperature range.

Given that the high-temperature sample is in a vacuum environment with the objective lens 33 and the internal optical path assembly 32, heat energy transfer occurs solely via heat radiation. Consequently, the objective lens 33 and the internal optical path assembly 32 are subjected to heat radiation from the high-temperature sample, resulting in temperature increases. Additionally, since these components are in contact with each other and with the external environment, heat energy transfer via conduction and convection occurs. In the simulation model, heat radiation from the high-temperature sample to the laser processing system structure is simulated using the surface-to-surface radiation module of COMSOL. Heat transfer within the sleeve member 51 and the external optical path assembly 31, as well as heat transfer with air, is simulated using the heat transfer module. A convective heat conductivity coefficient with the external environment is set to 10 W/(m² K).

Figure 11:
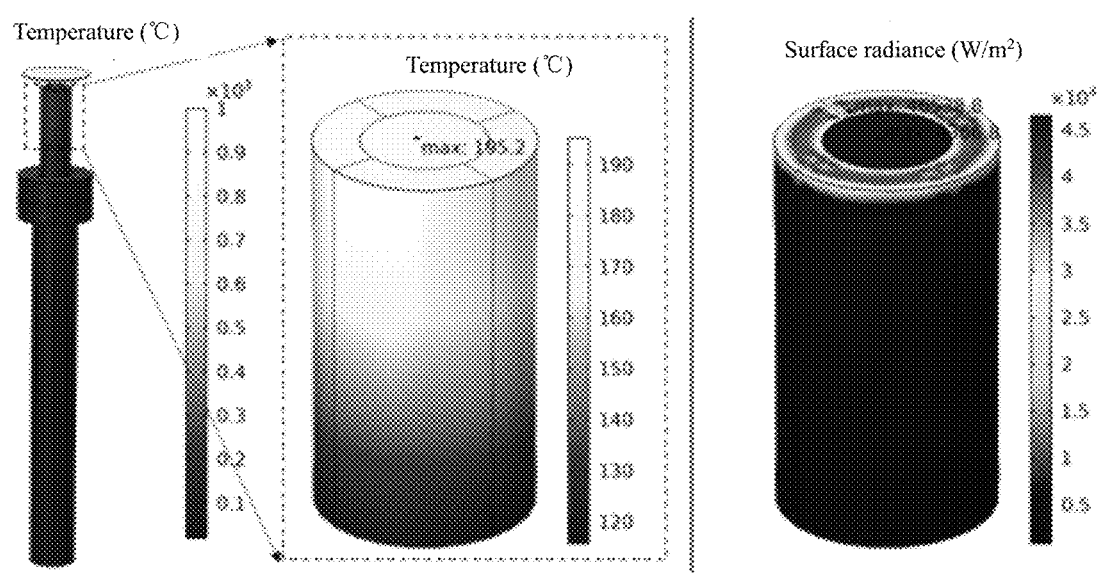
FIG. 11 shows the distribution of local structure and thermal radiation simulation results of the objective lens of the model of the femtosecond laser processing system of the integrated MBE device of the present invention with the addition of the shield body.

Referring to FIG. 11, the temperature distribution diagram of the model on the leftmost side indicates that the highest temperature is concentrated in the objective lens portion, particularly on the upper surface of the first lens. This temperature, reaching 195.2° C., significantly exceeds the operating temperature of the lens. Without appropriate protective measures, the objective lens 33 cannot function properly and may even sustain damage. The radiation diagram on the rightmost side illustrates that the upper surface of the objective lens 33, facing the sample surface directly, receives the most radiation. The maximum radiance received by the upper surface of the lens barrel is 46538.8 W/m², while the maximum radiance received by the upper surface of the lens is 4366.8 W/m². This difference is primarily due to the materials used; the lens barrel, made of alloy steel, is opaque and absorbs significant heat radiation, whereas the lens, made of ZF6 glass, is semi-transparent and possesses high surface transmittance in certain bands, potentially exceeding 99%.

In Step 3, the radiation prevention structure consists of a shield body 41 and a heat-insulation light-transmission member 42, designed to block most of the radiation and reduce the radiance received by the objective lens, thus lowering its temperature.

Figure 12:
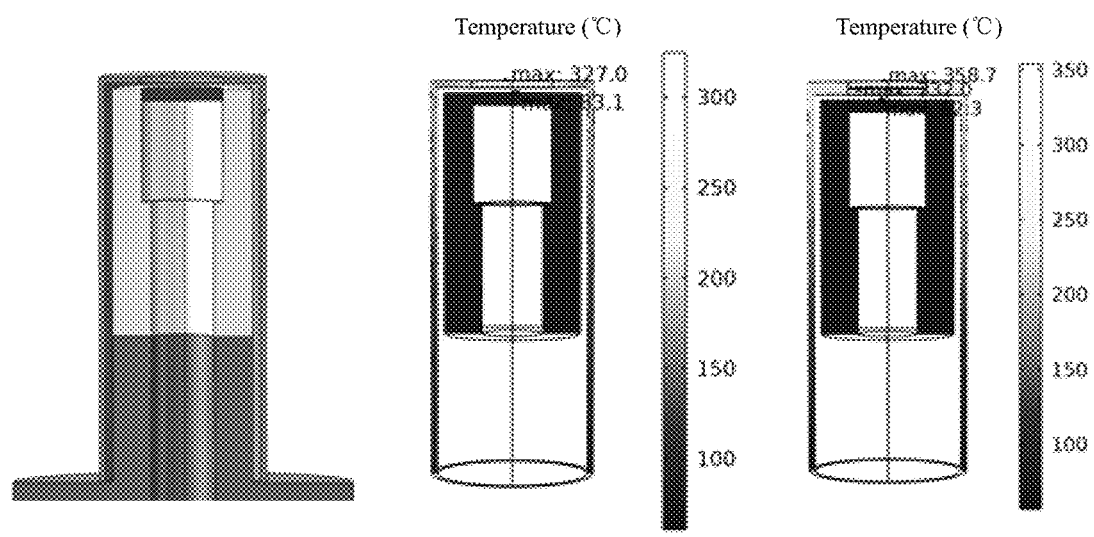
FIG. 12 shows the distribution of the simulation results of the temperature of the shield body, the objective lens and the cooling water at different water flow rates of the femtosecond laser processing system of the integrated MBE device of the present invention.

Referring to FIG. 12, the maximum temperature of the shield body 41 is observed on the upper surface of the quartz glass, reaching 327.0° C., while the maximum temperature of the objective lens 33 is on its upper surface at 83.1° C. Although the radiation prevention shield body significantly reduces the temperature of the objective lens, it remains slightly higher than its operating temperature. Additionally, one heat-insulation light-transmission member 42 is added to the shield body 41, maintaining a thickness of 2 mm and positioned 0.5 mm from the first piece of heat-insulation light-transmission member 42. Simulation results of this structure's heat radiation at vacuum high temperatures reveal that the maximum temperature of the upper layer of quartz glass is 358.7° C., the maximum temperature of the lower layer of quartz glass is 232.0° C., and the maximum temperature of the objective lens is 62.3° C. Although the maximum temperature of the objective lens still slightly exceeds its operating temperature, it's noticeably lower.

Step 3 further involves simulating the number of heat-insulation light-transmission members 42 to be installed and selecting the optimal number based on simulation data.

If the number of heat-insulation light-transmission members 42 is continually increased, the maximum temperature of the objective lens 33 will remain within its operating temperature range. However, excessive installation may impact the optical system design of the objective lens 33, affect laser quality, and increase laser loss during transmission, ultimately affecting the laser system's processing and imaging capabilities. By limiting the heat radiation blocked by the shield body 41, the accumulated heat in the objective lens 33, the internal optical path assembly 32, and the external optical path assembly 31 can be rapidly transmitted to the external environment through increased heat transmission, thereby reducing the objective lens 33's structural temperature.

Common cooling methods in this embodiment include air cooling and water cooling, each with its advantages and disadvantages. Air cooling structures are simple to install and primarily enhance convective heat dissipation by blowing air to remove radiator heat. However, their effectiveness is inferior to water cooling. The cooling pipeline design favors water cooling heat dissipation, requiring circulating cooling water through a water cooling box to dissipate heat.

Figure 13:
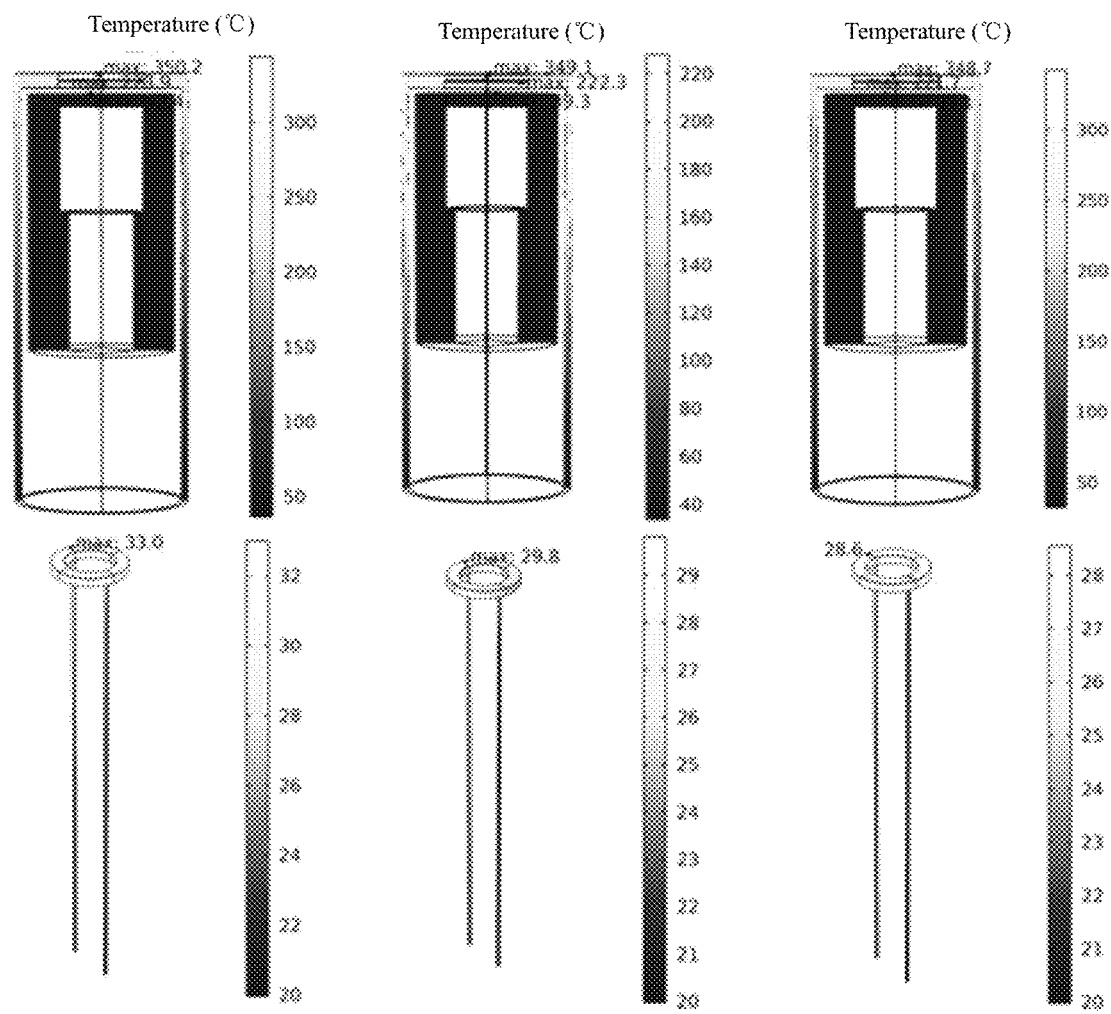
FIG. 13 shows the distribution of temperature simulation results of the optical path mechanism of the femtosecond laser processing system of the integrated MBE device of the present invention under 300° C. baking in the MBE growth chamber.

In Step 5, as depicted in FIG. 13, analog simulations are conducted for temperature distributions of the laser processing system structure under three different cooling water flow rates (0.05 m/s, 0.08 m/s, and 0.10 m/s) with a cooling water temperature of 20° C. When the cooling water flow rate is 0.05 m/s, the maximum temperatures of the upper and lower layers of the heat-insulation light-transmission member 42 on the shield body 41 and the second concave lens 3311 of the objective lens 33 are 350.2° C., 223.9° C., and 42.3° C., respectively. Notably, the maximum temperature of the second concave lens 3311 remains below 50° C., ensuring the entire objective lens 33 stays within its normal operating temperature range.

Subsequently, an optimized solution is achieved, incorporating a shield body 41 and cooling mechanism 5. The shield body 41 blocks a significant amount of heat radiation, while the cooling mechanism 5 facilitates the timely conduction of accumulated heat to the external environment.

Thus, even in a vacuum high-temperature environment, the objective lens 33 maintains its normal operating temperature range.

When the cooling water flow rate is 0.08 m/s, the maximum temperatures of the upper and lower layers of the heat-insulation light-transmission member 42 on the shield body 41 and the second concave lens 3311 of the objective lens 33 are 349.1° C., 222.3° C., and 39.2° C., respectively. At a cooling water flow rate of 0.10 m/s, these temperatures further decrease to 348.7° C., 221.7° C., and 38.1° C., respectively. Clearly, higher cooling water flow rates result in lower structure temperatures. At all three cooling water flow rates, the most significant temperature reduction is observed in the objective lens, followed by the lower layer of the heat-insulation light-transmission member 42 on the shield body 41, and then the upper layer of the heat-insulation light-transmission member 42.

Additionally, since the MBE device requires internal baking for 2-3 days before powering up, maintaining an internal temperature of 300° C., even during this period when the objective lens 33 is inactive, its temperature must not be excessively high to prevent damage.

Figure 14:
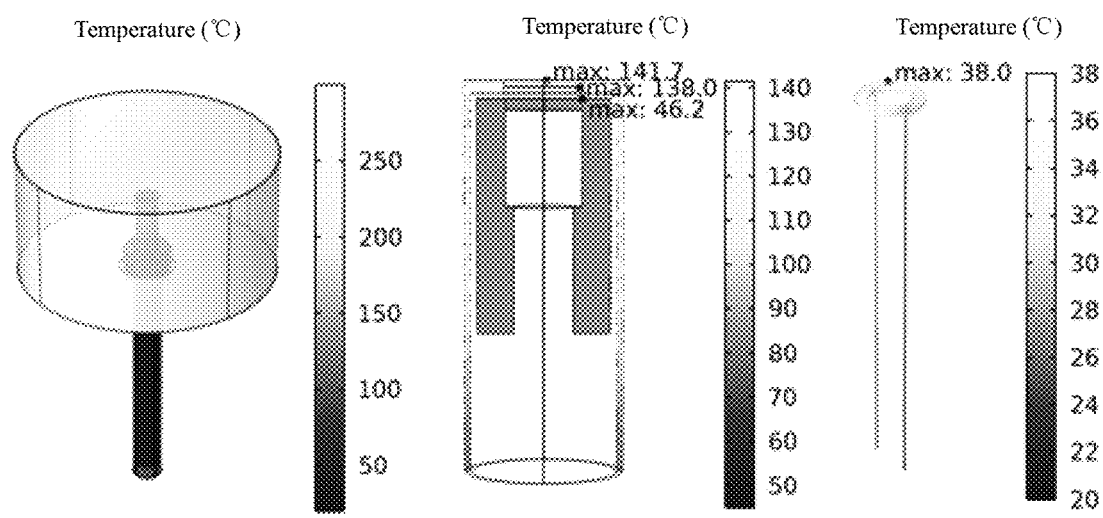
FIG. 14 shows the distribution of STOP simulation results of the objective lens and shield body structure of the femtosecond laser processing system of the integrated MBE device of the present invention.

As illustrated in FIG. 14, during sample baking, the MBE growth chamber 1 temperature reaches 300° C. Under these conditions, with a cooling water flow rate set to 0.20 m/s, the simulation model reaches a stable state. The maximum temperatures of the upper and lower layers of the heat-insulation light-transmission member 42 on the shield body 41 and the second concave lens 3311 of the objective lens 33 are 141.7° C., 138.0° C., and 46.2° C., respectively. Consequently, the temperature of the objective lens 33 remains within its normal operating range. The maximum temperature of the cooling water is 38.0° C. Based on the simulation result, the objective lens 33 maintains a temperature within its normal range when the MBE growth chamber 1 bakes the sample at 300° C.

It's important to note that while the shield body 41 and the objective lens 33 experience high temperatures in the laser processing system, the internal and external optical paths and the sleeve member 51 are farther from the high-temperature sample, receive less intense heat radiation, and are closer to the cooling channel. Consequently, these components effectively reduce their temperature through the water-cooling channel. Compared to the shield body 41 temperature, the temperatures of the internal and external optical path structures and the sleeve member 51 are significantly lower, resulting in minimal thermal stresses and displacements. Therefore, the structural-thermal-optical performance analysis primarily focuses on the shield body 41 and the objective lens 33.

Figure 15:
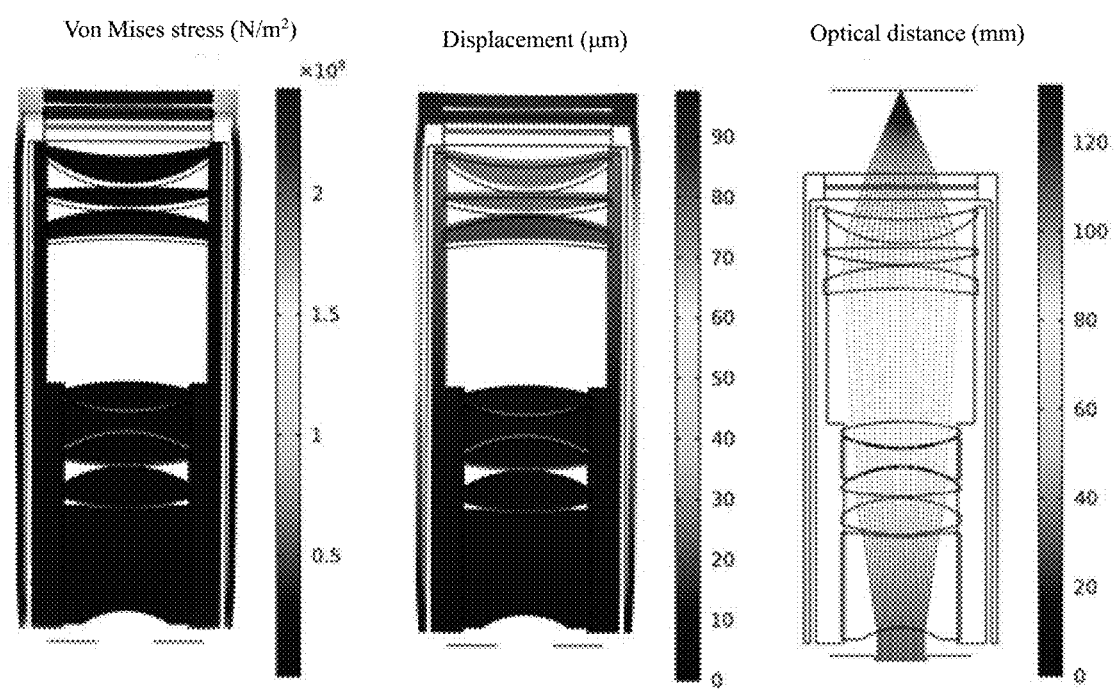
FIG. 15 shows a point-list diagram of the objective lens system under the effect of temperature field and structural field coupling of the femtosecond laser processing system of the integrated MBE device of the present invention.

As depicted in FIG. 15, the analysis process in Step 7 involves using solid mechanics, solid heat transfer, and geometric optics modules in COMSOL. To simplify the simulation process, surface-to-surface radiation is not directly used to simulate heat radiation when analyzing the structure thermally. Instead, temperature results from the heat radiation simulation in Step 5 are utilized as temperature conditions in solid heat transfer. Additionally, simulation results of the cooling water at a flow rate of 0.1 m/s are employed. Maximum temperatures at specific positions are as follows: 348.7° C. for the shield body 41, 221.7° C. for the upper layer of the heat-insulation light-transmission member 42, 38.1° C. for the lower layer of the heat-insulation light-transmission member 42, 34.5° C. for the lens of the objective lens 33, and 93.3° C. for the rear end face of the objective lens 33, and for the rear end face of the shield body 41. These simulations simplify the process without compromising accuracy. In the solid mechanics module, fixed constraints are applied to the rear end faces of the objective lens 33 and the shield body 41, and the structure parts are unified. This setup is configured similarly in the geometric optics module for ray tracing simulations described above.

Figure 16:
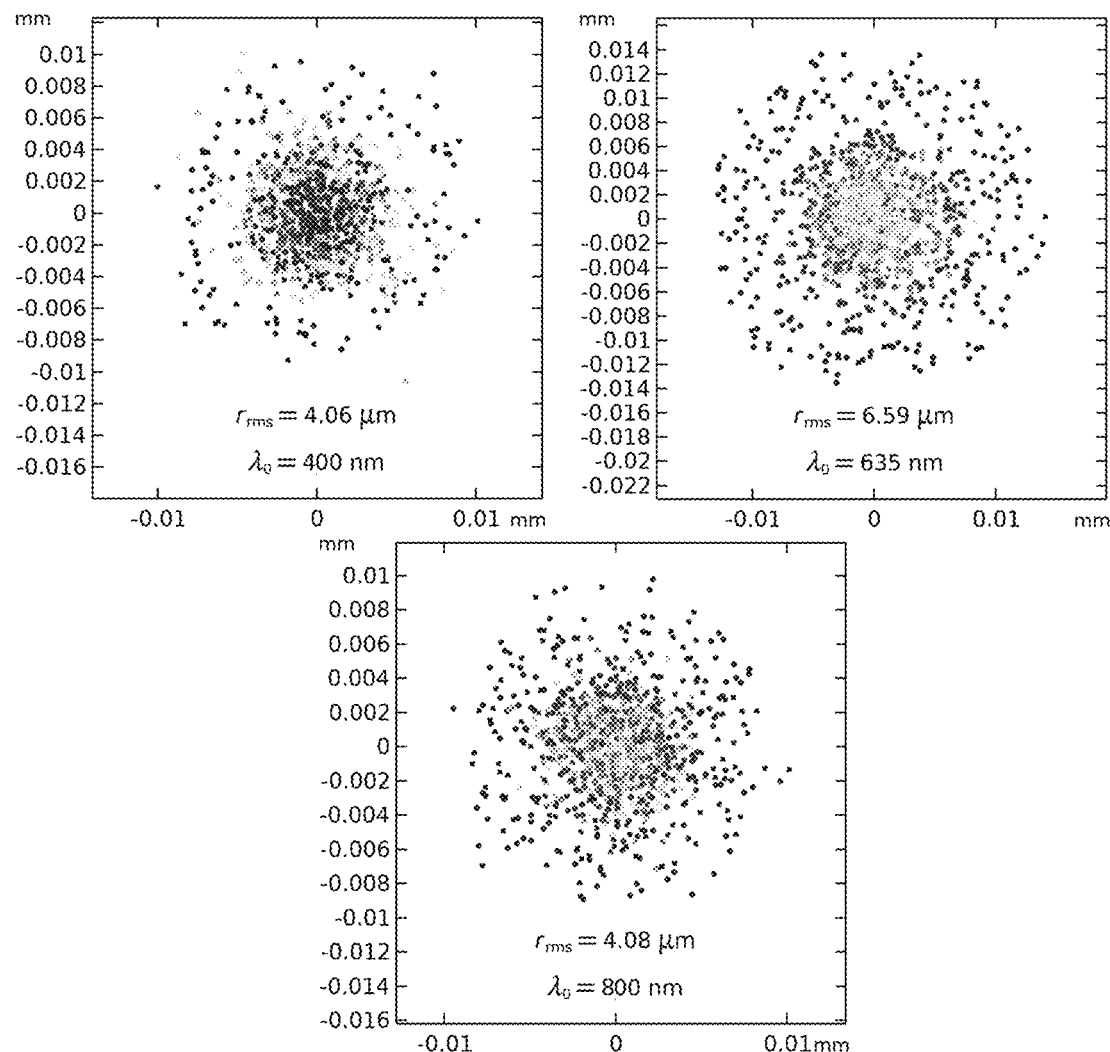
FIG. 16 shows a schematic diagram of the structural connection between the cooling mechanism and the telescopic kit of the femtosecond laser processing system of the integrated MBE device of the present invention.

After establishing the geometric structure and setting boundary conditions using COMSOL, simulations are conducted on the objective lens 33 and the shield body 41. Stress primarily accumulates in the connection between the shield body 41 and the heat-insulation light-transmission members 42 due to their disparate thermal expansion coefficients—the shield body, made of alloy steel, expands more than the light-transmission members. The maximum displacement occurs at the top of the shield body due to its higher thermal expansion coefficient, reaching 97.5 μm, while the displacement is smaller on the objective lens 33 due to its lower temperature. Temperature-induced thermal stresses alter the geometry of the structure and the position of the lens, impacting the optical system. The right figure illustrates the results of ray tracing based on temperature and structural fields. As shown in FIG. 16, root-mean-square radius values of the plot diagram at wavelengths of 400 nm, 635 nm, and 800 nm are 4.06 μm, 6.59 μm, and 4.08 μm, respectively. In comparison, without temperature equalization, these values are 1.808 μm, 3.365 μm, and 2.548 μm, respectively. Despite increased values due to the coupling effect of temperature and structure, they remain within an acceptable range, ensuring normal operation of the objective under vacuum high-temperature conditions.

Operating Principle:

The optical path mechanism 3 is inserted into the MBE growth chamber 1 through its opening, where the telescopic sleeving member is affixed to the MBE growth chamber 1 via a flange in a sealed connection. This seals the MBE growth chamber 1 with the optical path mechanism 3, leaving the internal optical path assembly 32 partially exposed to vacuum. The shield body 41 and heat-insulation light-transmission member 42 work together to reduce radiance received by the objective lens 33 and lower its temperature. Simultaneously, circulating liquid from external cooling equipment flows through the first cavity 510, dissipating heat and preventing its accumulation.

These embodiments represent the invention's preferred embodiments and should not limit its scope. Any modifications, equivalent replacements, improvements, etc., made within the spirit and principles of the invention should be considered within the protection scope of the invention.

What is claimed is:

1. A laser processing system integrated with an MBE device, comprising an MBE growth chamber (1) and a sample table (2), wherein an opening is formed in a side of the MBE growth chamber (1), and the sample table (2) is fixed in the MBE growth chamber (1), corresponding to a position of the opening, and used for placing a substrate sample material; the laser processing system further comprises an optical path mechanism (3), a heat insulation mechanism (4), and a cooling mechanism (5), wherein the optical path mechanism (3) is relatively arranged on a side of the MBE growth chamber (1); the optical path mechanism (3) is provided with a light emitting end, a side of the light emitting end penetrates through the opening of the MBE growth chamber (1), extends into the MBE growth chamber (1), and is spaced apart from the sample table (2); the optical path mechanism (3) is sealedly connected to the opening of the MBE growth chamber (1); the optical path mechanism (3) comprises an external optical path assembly (31), an internal optical path assembly (32), and an objective lens (33); an end of a side of the external optical path assembly (31) penetrates through the opening of the MBE growth chamber (1) and extends into the MBE growth chamber (1); the external optical path assembly (31) is used for being connected to an external laser devicel; the internal optical path assembly (32) is arranged at the end of the external optical path assembly (31) extending into the MBE growth chamber (1) and is arranged concentrically with the external optical path assembly 31; the objective lens (33) is arranged at an end of a side of the internal optical path assembly (32) away from the external optical path assembly (31); the objective lens (33) serves as the light emitting end of the optical path mechanism (3), and a laser is output by the external laser device, is reflected into the internal optical path assembly (32) through the external optical path assembly (31), and processes the substrate sample material through the objective lens (33); the heat insulation mechanism (3) is arranged on a side of the light emitting end of the optical path mechanism (3) and is used for reducing heat radiation reaching the lens of the optical path mechanism (3); the heat insulation mechanism (4) comprises a shield body (41) and a heat-insulation light-transmission member (42); the shield body (41) is cylindrical, internally hollow, arranged on a side of the external optical path assembly (31) close to the sample table (2), and located on outer sides of the internal optical path assembly (32) and the objective lens (33); a side of the shield body (41) close to the sample table (2) is provided with a light transmission hole; the heat-insulation light-transmission member (42) is arranged in the shield body (41), located on a side of the objective lens (33) away from the internal optical path assembly (32), and arranged concentrically with an axis of the objective lens (33); the shield body (41) is made of alloy steel, has a smooth face, and a gold film is arranged on the outer surface of the shield body (41) for rapid heat conduction; the number of the heat-insulation light-transmission members (42) is at least two, and the at least two heat-insulation light-transmission members (42) are spaced apart in an axial direction of the shield body (41) and are made of quartz glass; the cooling mechanism (5) is arranged on an outer side of the optical path mechanism (3) and has a cooling channel, and a heat exchange medium flows in the cooling channel and is used for transferring accumulated heat by the optical path mechanism (3) to the outside quickly.

2. The laser processing system integrated with the MBE device according to claim 1, wherein the cooling mechanism (5) includes a sleeve member (51) and an internal support member (52); the sleeve member (51) is arranged on an outer side of the external optical path assembly (31) and is fixed to a side of the external optical path assembly (31) away from the internal optical path assembly (32) by a flange; at least two liquid passage openings symmetrically distributed are formed in an outer side of the sleeve member (51). The internal support member (52) is fixedly arranged in the sleeve member (51), dividing an internal space of the sleeve member (51) into a first cavity (510) and a second cavity (520) which are not in communication with each other; the first cavity (510) serves as the cooling channel of the cooling mechanism (5) and communicates with the liquid passage openings, and the second cavity (520) is used for accommodating the external optical path assembly (3); the heat exchange medium flows in the liquid passage openings and the first cavity (510) and carries away the heat conducted by the objective lens (33).

3. The laser processing system integrated with the MBE device according to claim 2, further including an adjusting mechanism (6); the adjusting mechanism (6) is fixed relatively to the ground and spaced apart from the MBE growth chamber (1); the adjusting mechanism (6) is provided with a movable portion that can move in a multi-dimensional mode. A side of the sleeve member (51) away from the internal optical path assembly (32) is fixed to a center of the movable portion by a flange, and the adjusting mechanism (6) drives multi-dimensional adjusting of the optical path mechanism (3) connected to the sleeve member (51) so as to move a position of the laser focused on the surface of the substrate sample material.

4. The laser processing system integrated with the MBE device according to claim 3, wherein the adjusting mechanism (6) is a six-degree-of-freedom motion platform.

5. The laser processing system integrated with the MBE device according to claim 4, further including a telescopic sleeving member (7); the telescopic sleeving member (7) is arranged on the outer side of the sleeve member (51) and is located in the MBE growth chamber (1); two ends of the telescopic sleeving member (7) are respectively fixedly connected to a side of the sleeve member (51) close to the heat insulation mechanism (4) and to the opening of the MBE growth chamber (1) by flanges and are sealed therewith; the telescopic sleeving member (7) is spaced apart from an outer wall of the sleeve member (51) and is used for ensuring movement sealing between the optical path mechanism (3) and the MBE growth chamber (1).

6. The laser processing system integrated with the MBE device according to claim 1, further including a sealing assembly (8); two side ends of the sealing assembly (8) are sealedly connected to the internal optical path assembly (32) and the external optical path assembly (31) respectively by flanges; the sealing assembly (8) has a light transmission portion for transmitting light from a side of the external optical path assembly (31) to a side of the internal optical path assembly (32) for a laser source, and the internal optical path assembly (32) is in a vacuum environment in the MBE growth chamber (1) through the sealing assembly (8).

* * * * *